(12) United States Patent
Huang et al.

(10) Patent No.: US 9,155,226 B2
(45) Date of Patent: Oct. 6, 2015

(54) FAN CONTROL METHOD

(71) Applicant: DELTA ELECTRONICS, INC., Taoyuan Hsien (TW)

(72) Inventors: Yueh-Lung Huang, Taoyuan Hsien (TW); Jung-Yuan Chen, Taoyuan Hsien (TW); Ching-Sen Hsieh, Taoyuan Hsien (TW); Chia-Lin Lee, Taoyuan Hsien (TW); Jian-Cun Lin, Taoyuan Hsien (TW); Yen-Hung Chen, Taoyuan Hsien (TW); Chia-Ming Hsu, Taoyuan Hsien (TW)

(73) Assignee: DELTA ELECTRONICS, INC., Taoyuan Hsien (TW)

( * ) Notice: Subject to any disclaimer, the term of this patent is extended or adjusted under 35 U.S.C. 154(b) by 421 days.

(21) Appl. No.: 13/666,635

(22) Filed: Nov. 1, 2012

(65) Prior Publication Data

US 2013/0263894 A1 Oct. 10, 2013

(30) Foreign Application Priority Data

Apr. 9, 2012 (TW) .............................. 101112407 A

(51) Int. Cl.
*H05K 7/20* (2006.01)
*F04D 25/10* (2006.01)

(52) U.S. Cl.
CPC ............ *H05K 7/20209* (2013.01); *F04D 25/10* (2013.01)

(58) Field of Classification Search
CPC . H05K 7/20209; F04D 25/10; F21V 33/0096; B08B 5/02; B08B 5/04
See application file for complete search history.

(56) References Cited

U.S. PATENT DOCUMENTS

| 2005/0108996 | A1* | 5/2005 | Latham et al. | 55/385.2 |
| 2007/0001634 | A1* | 1/2007 | Wei et al. | 318/254 |
| 2007/0012181 | A1* | 1/2007 | Niezgoda et al. | 95/1 |
| 2012/0287604 | A1* | 11/2012 | Lan et al. | 362/96 |

FOREIGN PATENT DOCUMENTS

| CN | 1967442 A | 5/2007 |
| TW | I308678 | 4/2009 |

* cited by examiner

Primary Examiner — Michael Kornakov
Assistant Examiner — Natasha Campbell
(74) Attorney, Agent, or Firm — Muncy, Geissler, Olds & Lowe, P.C.

(57) ABSTRACT

A fan control method includes the steps of: acquiring a control factor; determining whether the control factor is located in a first range or a second range; executing a first dust removing mode if the control factor is located in the first range; executing a second dust removing mode if the control factor is located in the second range; and executing a normal mode if the control factor is not located in the first range and the second range.

8 Claims, 2 Drawing Sheets

FAN CONTROL METHOD

CROSS REFERENCE TO RELATED APPLICATIONS

This Non-provisional application claims priority under 35 U.S.C. §119(a) on Patent Application No(s). 101112407 filed in Taiwan, Republic of China on Apr. 9, 2012, the entire contents of which are hereby incorporated by reference.

BACKGROUND OF THE INVENTION

1. Field of Invention

The invention relates to a fan control method.

2. Related Art

The major conventional method for heat dissipation in various kinds of electronic devices is to configure a fan for enforcedly increasing the air convection to suppress the rise of temperature in the electronic device. However, after operated for a long period of time, dusts or some objects may be accumulated on the blades or fan frame of the fan, which results in the reduction of the heat dissipation efficiency of the fan.

The current method of removing dusts from a fan is simply to rotate the blades reversely. However, when the sizes of the dusts or objects are too large or too small, it is inefficient to remove dusts or objects merely by rotating the blades reversely.

Therefore, it is an important subject to provide a fan control method which can perform different dust removing modes corresponding to dusts or objects of different sizes.

SUMMARY OF THE INVENTION

In view of the foregoing subject, an objective of the invention is to provide a fan control method which can perform different dust removing modes.

To achieve the above objective, the present invention discloses a fan control method including the following steps of: acquiring a control factor; determining whether the control factor is located in a first range or a second range; executing a first dust removing mode if the control factor is located in the first range; executing a second dust removing mode if the control factor is located in the second range; and executing a normal mode if it is determined that the control factor is not located in the first range and the second range.

In one embodiment, the first dust removing mode is to control the fan to forwardly and reversely rotate alternately by a first rotation angle within a predetermined operation time, and the second dust removing mode is to control the fan to forwardly and reversely rotate alternately by a second rotation angle within the predetermined operation time. Herein, the first rotation angle is between 90 degrees and 270 degrees, and the second rotation angle is between 30 degrees and 60 degrees.

In one embodiment, the control method further comprises the steps of: determining whether the control factor is located in a third range; and executing a third dust removing mode if the control factor is located in the third range. The third dust removing mode is to control the fan to forwardly and reversely rotate alternately, while the fan is stepped forward or backward.

In one embodiment, the control factor is a voltage value, a current value or a power value, and the step of acquiring the control factor is performed by reading, measuring or calculating to obtain the control factor.

As mentioned above, the fan control method of the invention determines whether to enable the fan to perform a dust removing mode based on a control factor, and simultaneously determines to perform a first dust removing mode or a second dust removing mode. The first dust removing mode is to forwardly and reversely rotate the fan alternately in a large angle to remove dusts or objects of larger sizes by large movements of the blades. Furthermore, the second dust removing mode is to forwardly and reversely rotate the fan alternately in a small angle to remove dusts or objects of smaller sizes by small movements of the blades. Accordingly, the fan of the invention can perform different dust removing modes in view of the sizes of dusts and objects, thereby avoiding the reduction of heat dissipation efficiency of the fan.

Moreover, the fan control method of the invention may further include a third dust removing mode, which is to forwardly and reversely rotate the fan alternately in a smaller angle, while the fan is stepped forward or backward, thereby enabling the fan to remove dusts or objects of further smaller sizes.

BRIEF DESCRIPTION OF THE DRAWINGS

The present invention will become more fully understood from the subsequent detailed description and accompanying drawings, which are given by way of illustration only, and thus are not limitative of the present invention, and wherein.

DETAILED DESCRIPTION OF THE INVENTION

The present invention will be apparent from the following detailed description, which proceeds with reference to the accompanying drawings, wherein the same references relate to the same elements.

Figure 1:
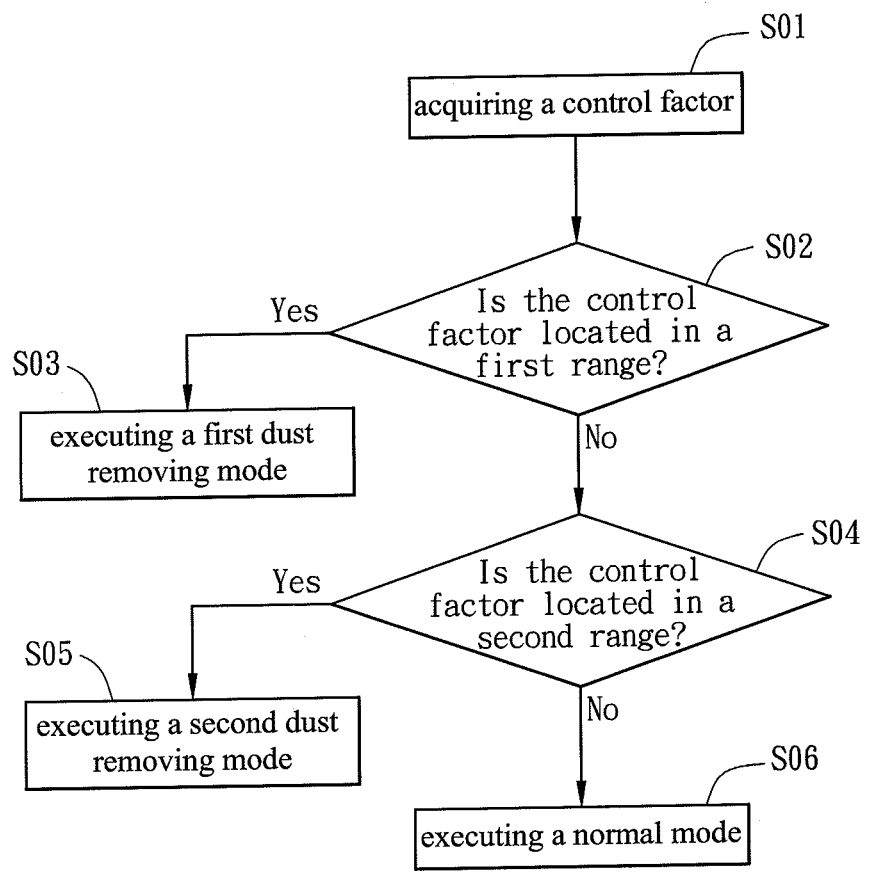
FIG. 1 is a flowchart of the fan control method according to a preferred embodiment of the invention.

FIG. 1 is a flowchart of the fan control method according to a preferred embodiment of the invention. Referring to FIG. 1, the control method includes steps S01 to S06.

Firstly, the step S01 is to acquire a control factor. Herein, the control factor is obtained by way of reading, measuring or calculating. For example, the control factor is a voltage value, a current value or a power value. In practice, the control factor may be obtained by reading (or measuring) the current value or the voltage value from the signal feedback unit in the fan, or by calculating the power value according to the read current value and/or voltage value.

Subsequently, the step S02 is to determine if the control factor is located in a first range. In the embodiment, the first range is for example a range of the voltage value, the current value or the power value, and can be preset in a comparing unit as a reference value according to different fans. For example, the first range is, for example but not limited to, from 0 volt to 2 volts. Furthermore, the first range is set in correspondence to the obtained control factor. For example, if the control factor obtained in the step S01 is a voltage value, the preset first range is a range of a voltage value, and then the comparison result of the obtained control factor is input into a control unit of the fan. Similarly, if the obtained control factor in the step S01 is a current value, the preset first range is a range of a current value. Descriptions of similar analogies are omitted here for concise purpose.

If the determination result of the step S02 is yes, which means that the control factor is located in the first range, then the step S03 is performed to execute a first dust removing mode. In the present embodiment, after receiving the signal from the comparing unit, the control unit outputs a corresponding control signal into a driving unit, and then the driving unit drives the fan to execute the first dust removing mode. The first dust removing mode is to control the fan to forwardly rotate and reversely rotate by a first rotation angle alternately within a predetermined operation time. Herein, the first rotation angle is defined as the angle between the positions of a blade before and after a rotation. In this embodiment, the first rotation angle is, for example, between 90 degrees and 270 degrees. In other words, within the predetermined operation time, the blades of the fan are forwardly rotate for 90 degrees, then reversely rotate for 90 degrees, and then forwardly rotate for another 90 degrees, and so on. It should be noted that the sequence and angle of the forward rotations and reverse rotations are not limitative. The alternate forward rotations and reverse rotations of the fan in a large angle result the large movements of the blades, so that dusts or objects of larger sizes can be removed accordingly.

If the determination result of the step S02 is no, which means that the control factor is not located in the first range, then the step S04 is performed to determine whether the control factor is located in a second range. Similarly, the second range is for example a voltage value, a current value or a power value. In this embodiment, the second range is, for example but not limited to, from 2 volts to 4 volts. If the determination result of the step S04 is yes, which means that the control factor is located in the second range, then the step S05 is performed to execute a second dust removing mode. The second dust removing mode is to control the fan to forwardly rotate and reversely rotate by a second rotation angle alternately within a predetermined operation time. It should be noted that the predetermined operation time of the second dust removing mode and the predetermined operation time of the first dust removing mode can be the same or different, and they are not limited. Similarly, the second rotation angle is defined as the angle between the positions of a blade before and after a rotation. The second rotation angle is, for example, between 30 degrees and 60 degrees. In other words, within the predetermined operation time, the blades of the fan are forwardly rotate 30 degrees, then reversely rotate 30 degrees, and then forwardly rotate 30 degrees, and so on. It should be noted that the sequence and angle of the forward rotations and reverse rotations are not limitative. The alternate forward rotations and reverse rotations of the fan in a small angle result small movements of the blades, so that dusts or objects of smaller sizes can be removed accordingly.

If the determination result of the step S04 is no, which means that the control factor is not located in the second range, then the step S06 is performed to execute a normal mode. In other words, the fan continues to rotate in a normal state. Accordingly, the fan of the invention is able to perform different dust removing modes to prevent reduction of heat dissipation efficiency of the fan caused by the accumulation of dusts or objects.

Figure 2:
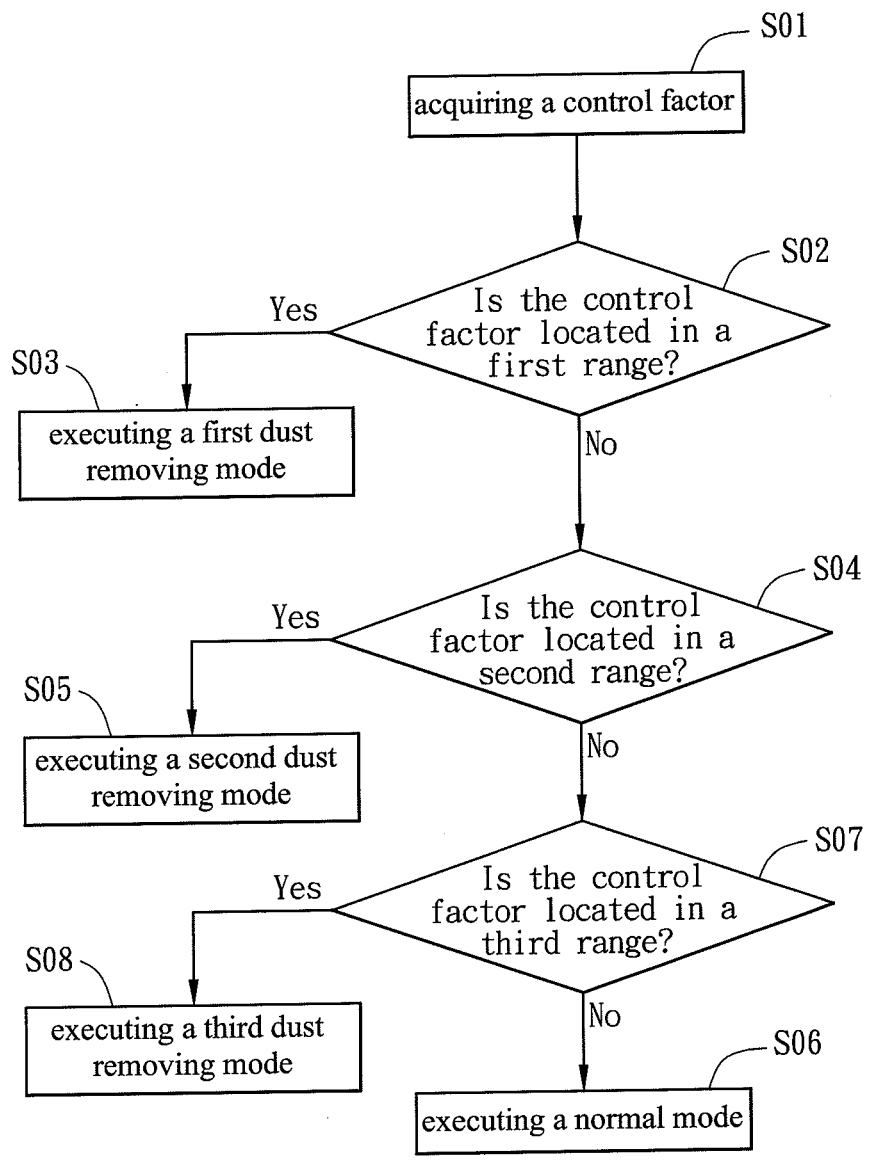
FIG. 2 is a flowchart of another fan control method of the invention.

FIG. 2 is a flowchart of another fan control method of the invention. Referring to FIG. 2, the control method further includes steps S07 and S08.

If the determination result of the step S04 is no, which means that the control factor is not located in the second range, the step S07 is performed to determine whether the control factor is located in a third range. The third range is also a voltage value, a current value or a power value. For example, the third range is, for example but not limited to, larger than 4 volts. If the determination result of the step S07 is yes, which means that the control factor is located in the third range, then step S08 is performed to execute a third dust removing mode. The third dust removing mode is to control the fan to forwardly rotate and reversely rotate alternately within a predetermined operation time, while the fan is stepped forward or backward. It should be noted that the predetermined operation time of the third dust removing mode can be the same as or different from those of the first and second dust removing modes. In the third dust removing mode, the angles of the alternate forward and reverse rotations are not limitative, and the blades are stepped forward and backward after the alternate forward and reverse rotations. In other words, within the predetermined operation time, the blades of the fan forwardly rotate for about 5 to 10 degrees, then reversely rotate for about 10 to 15 degrees, and then forwardly rotate for about 5 to 10 degrees, and so on. Accordingly, the fan is stepped backward with a fixed angle. It should be noted that the sequence and angle of the forward and reverse rotations are not limitative. The third dust removing mode can be set to forwardly and reversely rotate alternately in a further smaller angle, while the fan is stepped forward or backward, thereby further enabling the fan to remove dusts or objects of further smaller sizes.

To sum up, the fan control method of the invention determines whether to enable the fan to perform a dust removing mode based on a control factor, and simultaneously determines to perform a first dust removing mode or a second dust removing mode. The first dust removing mode is to forwardly and reversely rotate the fan alternately in a large angle to remove dusts or objects of larger sizes by large movements of the blades. Furthermore, the second dust removing mode is to forwardly and reversely rotate the fan alternately in a small angle to remove dusts or objects of smaller sizes by small movements of the blades. Accordingly, the fan of the invention can perform different dust removing modes in view of the sizes of dusts and objects, thereby avoiding the reduction of heat dissipation efficiency of the fan.

Moreover, the fan control method of the invention may further include a third dust removing mode, which is to forwardly and reversely rotate the fan alternately in a smaller angle, while the fan is stepped forward or backward, thereby enabling the fan to remove dusts or objects of further smaller sizes.

Although the present invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the present invention.

What is claimed is:

1. A fan control method, comprising:
    acquiring a control factor;
    determining whether the control factor is located in a first range or a second range;
    executing a first dust removing mode if the control factor is located in the first range;
    executing a second dust removing mode if the control factor is located in the second range; and
    executing a normal mode if it is determined that the control factor is not located in the first range and the second range,
    wherein the first dust removing mode is to control the fan to forwardly and reversely rotate alternately by a first rotation angle, wherein the second dust removing mode is to control the fan to forwardly and reversely rotate alternately by a second rotation angle,
wherein the first rotation angle is larger than the second rotation angle.

2. The control method according to claim 1, wherein the first dust removing mode is to control the fan to forwardly and reversely rotate alternately by the first rotation angle within a predetermined operation time.

3. The control method according to claim 2, wherein the first rotation angle is between 90 degrees and 270 degrees.

4. The control method according to claim 2, wherein the second dust removing mode is to control the fan to forwardly and reversely rotate alternately by the second rotation angle within the predetermined operation time.

5. The control method according to claim 4, wherein the second rotation angle is between 30 degrees and 60 degrees.

6. The control method according to claim 1, further comprising:
  determining whether the control factor is located in a third range; and
  executing a third dust removing mode if the control factor is located in the third range.

7. The control method according to claim 6, wherein the third dust removing mode is to control the fan to forwardly and reversely rotate alternately.

8. The control method according to claim 1, wherein the control factor is a voltage value, a current value or a power value, and the step of acquiring the control factor is performed by reading, measuring or calculating to obtain the control factor.

* * * * *